(12) United States Patent
Penza et al.

(10) Patent No.: US 6,370,076 B1
(45) Date of Patent: Apr. 9, 2002

(54) FOLDED ADDRESSING METHOD FOR MEMORY ARCHITECTURES

(75) Inventors: Luigi Penza; Gianluca Blasi, both of Vimercate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/580,663

(22) Filed: May 26, 2000

Related U.S. Application Data

(60) Provisional application No. 60/136,448, filed on May 28, 1999.

(51) Int. Cl.[7] .............................................. G11C 8/00
(52) U.S. Cl. ........................... 365/230.01; 365/230.02; 365/230.03; 711/202
(58) Field of Search ..................... 365/230.01, 230.02, 365/230.03; 711/202, 203, 204, 209

(56) References Cited

U.S. PATENT DOCUMENTS 5,943,693 A * 8/1999 Barth ..................... 365/230.01
6,055,204 A * 4/2000 Bosshart ................. 365/230.02

* cited by examiner

Primary Examiner—Richard Elms
Assistant Examiner—VanThu Nguyen
(74) Attorney, Agent, or Firm—Lisa K. Jorgenson; E. Russell Tarleton; Seed IP Law Group, PLLC

(57) ABSTRACT

A memory circuit having a first and a second block of memory cells with rows that cross both blocks and columns in each of the two blocks. A word decoder selects one of the rows, and a column decoder selects a set of columns from the first and second blocks. An address splitter passes relative portions of an address to each decoder. In one embodiment, the address splitter passes the most significant bits of the address to the word decoder and passes the remaining bits to a portion of the column decoder coupled to the first block only. The address splitter also modifies the remaining bits, using a bit subtractor, and passes them to a portion of the column decoder coupled to the second block only. A method of operating a memory device is provided that includes accepting an address at an input address circuit and then determining whether the address is for data in the first block or in the second block. This information is assessed by comparing it to the number of memory cells in the first block. If the address is for data in the first block, the address is parsed into high and low portions, and sent to the word and column decoders, respectively. If the address is for data in the second block, the low portion of the address is modified, or remapped, and sent to a circuit in the column decoder that is only coupled to the second data block.

19 Claims, 2 Drawing Sheets

FOLDED ADDRESSING METHOD FOR MEMORY ARCHITECTURES

This application claims benefit of U.S. No. 60/136,648 filed May 28, 1999.

TECHNICAL FIELD

This invention relates to an architecture for memory organization, and more specifically, for a method and architecture using a folded addressing method.

BACKGROUND OF THE INVENTION

Designers of Very Large Scale Integrated (VLSI) electronic circuits are increasingly pressed to reduce costs and development time. This is particularly true for microcontroller and microprocessor designs. In order to optimize substrate usage and minimize design cycle times, a layout plan of an Integrated Circuit (IC) is often constrained to have a fixed topology like the one shown in FIG. 1.

FIG. 1 shows a layout view of a typical IC 10. A central bus 20 carries signal interconnections within the IC 10. Signals are generated and received by a generic microprocessor 30, peripheral circuits 32, and memory circuits 34.

For a fast assembly of a complex device like the one depicted in FIG. 1, it is essential that all blocks are physically designed to have the same height, as shown by the fixed height arrows 36 on the right. In this way, a library of predefined macros or layouts can be designed and made available for a wide range of specific applications, allowing the complete IC 10 to be put together easily, e.g. by software, and with highest silicon utilization.

It is generally easy to shape the physical dimensions of digital and analog peripherals such that one side is at a fixed height. On the contrary, memory blocks introduce specific problems. In fact, for each possible memory function, there is a variety of configurations that can be used in a design.

Although the memory width, or parallelism, which is the number of bits that can be loaded into/from the memory in parallel, $N_B$, is generally fixed for a given IC architecture, the memory depth, which is the number of different locations independently addressable, or words $N_W$ varies with target applications and marketing strategies. It is therefore necessary to implement memory architectures that can expand in the direction of expandable arrows 38 in the memory circuits 34 of FIG. 1. This expansion allows the memory circuits 34 to be specifically designed to match the memory needs of the peripheral circuits 32 and the generic processor 30 when designing the IC 10.

For efficiency reasons, memory blocks are designed with a bi-dimentional decoding scheme. In all but very small memory blocks, the input address is decoded by two separate sub-circuits. The word decoder selects a physical row out of the number of Rows $N_R$ in a memory circuit. On each row, $N_M$ memory words are allocated. A column multiplexer (or mux) then selects one out of the $N_M$ words and routs it to the data I/O circuitry.

$N_R = N_W/N_M$ Number of physical rows in the memory matrix  1)

$N_C = N_M \times N_B$ Number of physical columns in the memory matrix  2)

The addressing space defined by $N_W$ must be continuous. If there are voids or holes in the address space, i.e., inputs between address=0 and address=$N_W$ corresponding to no physical location, all external subsystems accessing the memory block would have to perform complex processing to guarantee proper data storage and/or retrieval around the voids, which is not acceptable.

Usually, best performances, lowest power consumption, and highest memory density are achieved for $N_R \approx N_C$, or a generally square architecture where the number of rows is roughly equal to the number of columns. This implies (from equation 2) that optimal configurations are those for which $N_M \approx N_R/N_B$ $N_B$ generally equal to or greater than 8  3)

Because of equation 3, there are generally many more address bits devoted to word decoding than are used for column multiplexing. In order to enlarge the overall memory depth variation, it is the word decoder that has to vary in the direction of the expandable arrows 38 in the memory circuits 34 of FIG. 1, while the column mux must remain fixed. In other words, memory circuits 34 have to be placed in FIG. 1 with the matrix rotated 90°, making rows physically vertically oriented, and columns physically horizontally oriented.

In order to satisfy the addresses space continuity, the most significant address bits decode one out of $N_R$ rows and the least significant address bits select one out of $N_M$ words. Moreover, to preserve address space continuity, the number of words on each row ($N_M$) has to be a power of two, or $N_M = 2^m\, m=1,2,3,$  4)

So the first row allocates all the memory words ($M_W$) numbered from 0 to $2^m-1$, with no voids, the second row consists of words $2^m$ to $2^m+1 -1$, etc. If it is assumed a memory cell is designed for highest density and its dimension in the direction of the fixed height arrows 36 in FIG. 1 is $h_c$, then the height (H) of the memory block can only be:

$H = N_C \times h_c = N_B \times 2^m \times h_c\, m=1,2,3,$  5)

Generally, the values of H obtained through equation 5 are not optimal for the full IC 10, because the IC dimensions are mandated by efficiency and reliability specifications that cannot take into account all possible memory architectures. Hence, the need for a memory architecture that can preserve addressing continuity and optimize H to any value dictated by IC product definitions.

Some limited degree of freedom in defining H can be achieved through the so-called remainder technique. Assume the $N_M$ corresponding to the optimal H is:

$2/3 N < N_{Mopt} < N\ \ N=2^n;\ n=1,2,3$  6)

Then, memory rows can be designed ($N_{Mopt} \times N_B$) bits wide, and logically arranged into triplets. In a triplet arrangement, the first memory words are placed on the first row, which has a vertical orientation in the memory circuit 34 of the FIG. 1. The next $N - N_{Mopt}$ words constitute a remainder R1 and are kept aside. The words $N_{Mopt}+1$ to $2 \times N_{Mopt}$ are placed in the second row, which is also vertical the memory circuit 34 of FIG. 1. The next $N - N_{Mopt}$ words constitute a remainder R2. R1 and R2 are allocated on the third row of the triplet, denoted as the remainder row in a triplet arrangement. The next row, which is the fourth, starts a new triplet, and the remainder patterns are repeated until the memory addresses exhausted.

If $R1+R2 < N_{Mopt}$, then the remaining bits to fill the remainder row are left unused, which is very expensive in terms of substrate usage efficiency and cost. Limitations of the remainder method are numerous. The method applicability is limited by equation 6. The column mux can be so complex to require automatic synthesis tools to design the address bits scrambling and unused cell reject logic required by remainder rows. The word decoder is also complicated, as it has to differentiate between the first pair of each row triplet and the remainder row. Because of the points above, the method implies a substantial silicon overhead on memories with small/medium arrays, and a reduction in the performance of the memories.

Regarding the layout of a possible memory block using the remainder method, the entire memory floor plan and layout is affected, so that the memory is not reusable in IC configurations that are different from the one in FIG. 1, unless the full silicon and performance overhead of the remainder method is acceptable.

Also, in most cases, the silicon wasted on the unused cells in the remainder row deeply impacts the overall memory density. For instance, if $N_{Mopt}=\frac{3}{4}N$, then the remainder row would leave ⅓, or nearly 10% of the total memory cells unused. This inefficiency is too high for most applications.

Although the remainder method is in principle not limited to triplet arrangement, and can use any n-tuple, the circuit complexity and the area overhead increase unacceptably for sets having 4 or more rows.

Until now, no method or memory architecture has been developed which can simultaneously preserve address continuity while optimizing the height H of a memory device to a value dictated by an IC product specification, rather than the optimizing the height H based on the memory specifications itself.

SUMMARY OF THE INVENTION

Embodiments of the invention include a first and second block of memory cells having rows that cross both the blocks, but columns in only one of the blocks. A word decoder is coupled to the rows of memory cells and can select one of the rows in the first and second block. A column decoder is coupled to the columns of memory cells and can select a set of columns from the first and second blocks, depending on addresses input into it. An address splitter is coupled to both the word decoder and to the column decoder, and passes relative portions of the address to each. In one embodiment, the address splitter passes the most significant bits of the address to the word decoder, and passes the remaining bits to a portion of the column decoder coupled to the first block only. The address splitter also modifies the remaining bits, and passes them to a portion of the column decoder coupled to the second block only. In this embodiment, the address splitter is coupled to a bit subtractor in order to perform the bit modification.

In another embodiment, a method of operating a memory device includes accepting an address at an input address circuit, and then determining, based on the address, whether it addresses data in the first block or in the second block. In one embodiment it assess this information by comparing it to the number of memory cells in the first block. If the address data is for data in the first block, the address is parsed into high and low portions, and sent to the word and column decoders, respectively. If the address data is for data in the second block, the low portion of the address is modified, or remapped, and then sent to a circuit in the column decoder that is only coupled to the second data block.

DETAILED DESCRIPTION

In this description, discussion of steps or architectures well known to those skilled in the art has been abbreviated or eliminated for brevity. Although this description describes particular embodiments of the invention shown in the figures, the invention is not limited only to those embodiments discussed.

Figure 1:
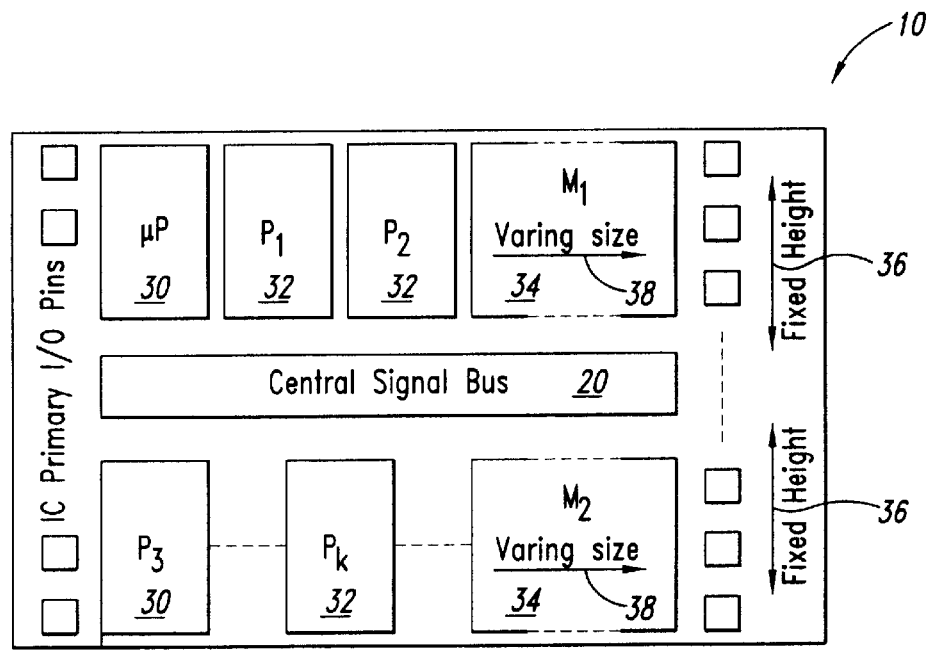
FIG. 1 is a block diagram of a conventional Integrated Circuit layout.
Figure 2:
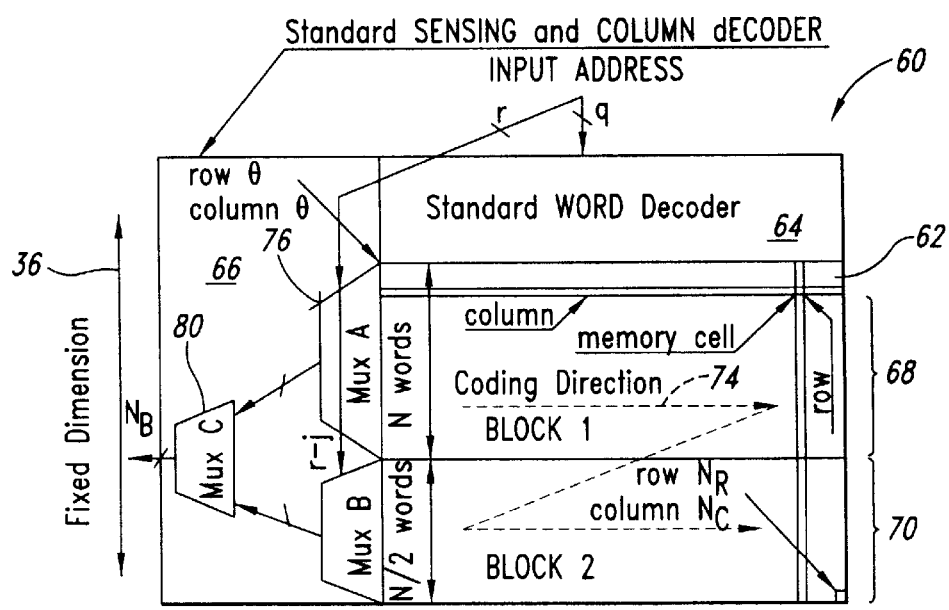
FIG. 2 is a block diagram of a memory cell layout according to an embodiment of the invention.

With reference to FIG. 2, if it is assumed that $N_M$, the number memory words on each row that corresponds to the optimal height H of a memory array 60 is:

$$N < N_{Mopt} < 2N \; N = 2^n; \; n = 0, 1, 2, 3, \qquad 7)$$

Then it is possible to represent $N_{Mopt}$ with the truncated series:

$$N_{Mopt} = a_0 N + a_1 \frac{N}{2} + a_2 \frac{N}{2^2} + \ldots + a_i \frac{N}{2^i} = a_0 N + \left( N \sum_{n=1}^{i} a_i \frac{1}{2^i} \right) \qquad 8)$$

with $a_i=0$, or $a_i=1$, i natural.
Because $$\sum_{n=1}^{\infty} \frac{1}{2^n} = 1 \qquad 9)$$

Then, equation 7 is satisfied.
Suppose, for simplicity, the test case with:
$a_0=a_1=1$; and
$a_i=0$ for i>1.
Then, $$N_{Mopt}=N+N/2 \qquad 10)$$

In other words, the best optimization usage of the memory cells is to have rows that have N+N/2, or 1½×N words.

Now, given x a real number, if:
ceil(x): the smallest integer greater than or equal to x; and
floor(x): the greatest integer smaller or equal to x; then
The minimum sufficient number of rows for the case solved in equation 10 is:

$$N_R = ceil\left(\frac{N_W}{N + \frac{N}{2}}\right) \qquad 11)$$

and, from equation 11:

$$N_R \times \left(N + \frac{N}{2}\right) \geq N_W \geq (N_R - 1) \times \left(N + \frac{N}{2}\right) \qquad 12)$$

The dis-equation 12 demonstrates that it is possible to design a memory block that limits the number of memory cells that are wasted due to them being out of the addressed space.

The memory array 60 of FIG. 2 shows an example of a memory array designed for the number of rows and columns just defined. The memory array 60 includes a memory matrix 62 coupled to a standard word decoder 64 and to a standard sensing and column decoder 66. The memory matrix 62 is further divided into a first block 68, Block 1, and a second block 70, Block 2. Recall that in the preferred embodiment, the rows run in the direction of the fixed dimension arrows 36, which in this case is the vertical orientation, and that the columns therefore run horizontally. As in conventional memory circuits, the word decoder 64 selects one of the rows to read, and the column decoder 66 reads the selected cells within that row, and presents data read from the stored cells to input/output circuitry (not shown).

Block 1 is a portion of the memory matrix 62 that includes $N_R$ rows and $N_1=N\times N_B$ columns. Block 2 is another portion of the memory matrix 62 that includes $N_R$ rows and $N_2=(N/2)\times N_B$ columns.

The address space is mapped physically in Block 1 and Block 2 in the direction depicted by the coding direction arrow 74, starting with an address 0 in a cell located at row 0, column 0, and depicted in the upper left hand corner of the memory matrix 62. The address space ends with a maximum last address with the cell in row $N_R$, column NC in the lower right hand corner of the memory matrix 62. It is possible to complete the addressing space before the last memory cell, but the number of any extra cells will be minimized using this architecture.

The word decoder 64 has an input giving the desired row number and then enables only one row at a time. As depicted in FIG. 2, a row crosses and therefore includes both Block 1 and Block 2.

The column decoder 66 includes a Mux A 76 coupled to the Block 1. Mux A 76 selects one out of the N words in Block 1 (from column 0 to N/2−1). The column decoder 66 also includes a Mux B 78 coupled to the Block 2. Mux B 78 selects one out of N/2 words in Block 2 (from column 0 to N/2−1). The Mux A 76 and Mux B 78 are both coupled to a Mux C 80, which accepts the $N_B$ bits from Mux A and the $N_B$ bits from Mux B, then forwards one of the sets of bits to the input/output circuitry (not shown).

Given the assumptions that:
  the address space starts with location 0 and stops with location $N_W-1$;
  Block 1 has $N_{BLK1}=N\times N_R$ locations, from location 0 to location $N_{BLK1}-1$; and
  Block 2 has $N_{BLK2}=(N/2)\times N_R$ locations, from location $N_{BLK1}$ to location $N_W$, as well as possibly, some cells never addressed.

Then, a method according to the embodiment of the invention includes the following processes.

$$\text{If } 0<=\text{address}<N_{BLK1}-1$$

The address is passed unmodified to the word and column decoders.

In detail, $q=\text{ceil}(\log_2(N_R))$ address bits are passed to the word decoders. As stated before, these are usually the most significant ones.

$$r=\text{ceil}(\log_2(N_W))-q=\text{ceil}(\log_2(N_W))-\text{ceil}((\log_2(N_R))=\text{floor}((\log_2(N_W))-\log_2(N_R))=\text{floor}(\log_2(N_W/N_R))$$

from equation 12:

$$\log(N_{Mopt}) \ge \log\left(\frac{N_W}{N_R}\right) \ge \log\left(\left(1-\frac{1}{N_R}\right)\times N_{Mopt}\right) \quad 13)$$

nd, since floor$(1-1/N_R)=0$, $$r = floor\left(\log\left(\frac{N_W}{N_R}\right)\right) = floor(\log(N_{Mopt})) = \log(N) \quad 14)$$

In conclusion, with the r least significant bits, all of the N words per row in Block 1 can be decoded by Mux A 76.

Mux B 78 is simultaneously driven with the (r−1) least significant bits. Block 2 has N/2 words per row, and its output, which is negligible, is filtered, or blocked through Mux C 80, and not allowed to pass to the input/output circuitry.

If the address is higher than $N_{BLK1}$, or $$N_{BLK1}<=\text{address}<=N_W$$

The original address has to be remapped in Block 2 locations. In this case, the output of Mux A 76 is filtered, or blocked, by Mux C 80, and only the output from Block 2 is passed to the input/output circuitry.

If a standard word and column decoding structure is used, Block 2 locations start with Address 0 (row 0, column 0), and stop with address $N_{BLK2}$ (row $N_R-1$, column (N/2−1)).

A possible remapping is:

| Original Address | Remapped Address in Block 2 |
|---|---|
| $N_{BLK1}$ | 0 |
| $N_{BLK1}+1$ | 1 |
| ... | ... |
| $N_W-2$ | $N_W-2-N_{BLK1}$ |
| $N_W-1$ | $N_W-1-N_{BLK1}$ |

Which can be obtained with the formula:

$$\text{Remapped Address=Original Address}-N_{BLK1} \quad 15)$$

Regarding the structure shown in FIG. 2, all of the physical locations in Block 2 with an address>$N_W-1-N_{BLK1}$ are unused. Also, the remapped address is always<(N/2)×$N_R$, So it requires only (q+r−1) bits for a binary representation. In a (q+r) bits binary representation, the Most Significant Bit (MSB) is always 0.

Implementing the remapping requires the use of a (q+r) bits subtractor.

Because $N_{BLK1}=N\times N_R$ and N is a natural power of two (N=2$^r$), the binary representation of $N_{BLK1}$ is always a (q+r) bit word, with the last r bits equal to 0. So, when subtracting an address greater than $N_{BLK1}$ with $N_{BLK1}$, the last r bits remain unchanged. A q bits subtractor is then sufficient to obtain the remapped address. This device subtracts only the q MSBs of the original address with the q MSBs of $N_{BLK1}$ (the binary representation of $N_R$). As demonstrated before, the MSB of the q bits word obtained with the subtraction is always 0. So, neglecting this non significant bit, the new address consists of (q+r−1) bits.

Because Block 2 has only one-half the locations as Block 1, only (q+r−1) bits are sufficient and necessary to decode all of the cells in Block 1. Because Block 2 has one-half the number of columns as Block 1, (r−1) bits (the least significant ones) are sufficient and necessary to decode from column 0 to (N/2−1). And, because Block 2 has the same rows as Block 1, q bits (the most significant ones) are sufficient and necessary to decode from row 0 to ($N_R-1$).

Therefore, of the remapped address, the last (r−1) bits have to be used in Mux B 78 to decode the columns while the first q bits are used in the standard row decoder.

The Folded Addressing Method according to embodiments of this invention can also be applied recursively, setting whatever combination of the $a_i$ coefficients. In this case, the waste of memory cells, that is those that are not addressed and are simply left over in the memory matrix 62, can be reduced to the minimum, and in theory can be reduced so as to leave no memory cells wasted.

Figure 3:
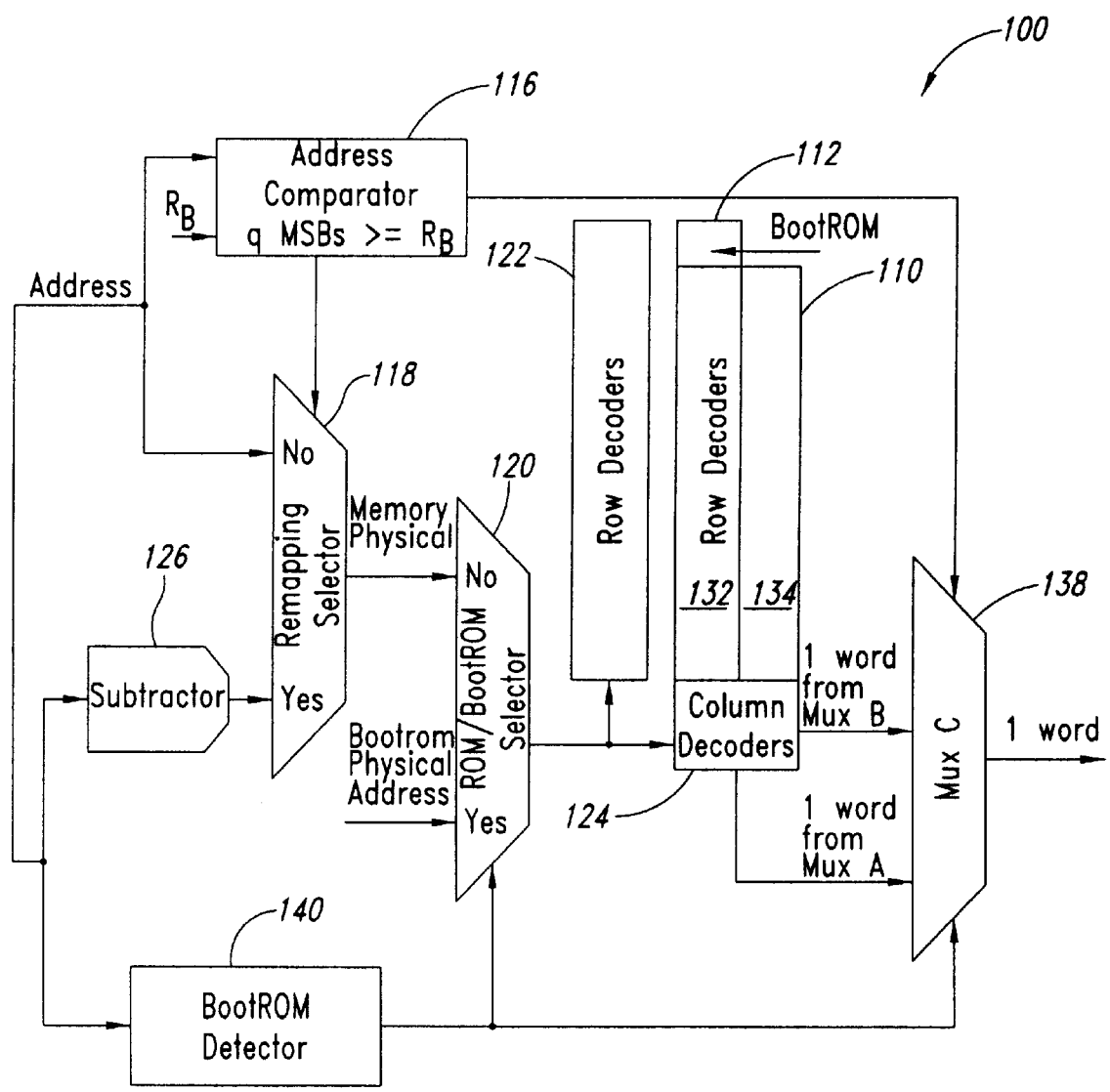
FIG. 3 is a block diagram of an integrated circuit including a memory cell layout according to an embodiment of the invention.

FIG. 3 shows a possible implementation of a memory circuit using the Folded Addressing Method, and also shows its versatility by adding an extra memory section. A main memory array 110 is integrated with a bootstrap memory BootROM 112. The BootROM 112 is relatively small, compared to the main memory 110. The bootstrap memory 112 contains a read only memory containing a program to be executed by an integrated circuit (IC) 100 at the time the IC 100 is started or reset.

An address comparator 116 compares the q MSBs of the address with $R_B$, the lowest address which requires a remapped address, as described with reference to FIG. 2. Based on this comparison, the comparator 116 defines two flags. One flag drives a remapping selector 118. A second flag drives the Mux C 138.

In operation, in one implementation, if the q MSBs of the address is less than $R_B$, that means the desired address is within a first portion 132 of the memory array 110, and not in a second portion 134 the main memory array 110. Thus, a NO signal (meaning that the address does not have to be remapped) is sent to the remapping selector 118, and the address, which is also an input to the remapping selector 118, is passed to a ROM/BootROM selector 120 unchanged.

Had the address been one of the addresses that required remapping, the address comparator 116 would have sent a YES signal to the remapping selector 118. Then, the remapped address, which comprises the original address passed through a subtractor 126, would be passed to the ROM/BootROM selector 120. In some embodiments, the subtractor 126 can serve as both the subtractor and also perform the comparator functions.

The ROM/BootROM Selector 120 passes the address in the memory array 110 of the ROM to a standard row decoder 122 and a standard column decoder 124. Those decoders 122, 124 select one row, and a column each from the first portion 132 and the second portion 134 of the memory array 110. The first portion 132 is coupled to a mux, which could be the Mux A 76 from FIG. 2. The second portion 134 is coupled to a mux, which could be the Mux B 78 from FIG. 2.

After the decoders 122, 124 are finished reading the data stored in the desired address of the memory array 110, one word each from Mux A and Mux B (within the column decoder 124) is passed to the Mux C 138. The Mux C 138 receives the NO signal from the address comparator 116, which signals the Mux C to select the non-remapped address, or the memory word from Mux A, coupled to the first portion 132 of the memory array 110.

Referring back to FIG. 3, also present is a BootROM detector 140. The BootROM detector 140 determines if data is desired to be read from the BootROM 112, such as when the IC 100 is started or reset. If so, a YES signal is passed to the ROM/BootROM selector 120, and the physical address of the BootROM 112 is passed to the decoders 122, 124. The physical location of the BootROM 112 in FIG. 3 is at the top of the first portion 132 of the memory array 110.

The data is read from the address provided to the decoders 122, 124, which points to the BootROM 112. The BootROM detector 140 provides a signal so that Mux C 138 will select the word from MUX A for output.

By using standard decoders, such as the row decoder 122 and column decoder 124, a library can be developed where integrated circuits can be quickly assembled, with maximum substrate utilization, in very short times with little expense. For instance, if only the first portion 132 or the second portion 134 of the memory array 110 were used, the same decoders 122, 124 could be used. This can optimize efforts for the layout and development to obtain various aspect ratios.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed is:

1. In a memory device including at least a first block containing a first number of memory cells and a second block containing a second number of memory cells, the memory cells organized in rows and columns such that the rows span the first and second blocks, and such that each column is in either the first or the second block, the first and second blocks being coupled to a word decoder that selects, based on a first address, one of the rows, the first block also being coupled to a first selection circuit in a column decoder that selects, based on a second address, at least one of the columns in the first block, and the second block being coupled to a second selection circuit in the column decoder that selects, based on a third address, at least one of the columns in the second block, a method comprising:

accepting a fourth address at an input address circuit;

determining whether the fourth address represents a group of cells in the first block or in the second block;

passing a first portion of the fourth address to the word decoder as the first address;

passing a second portion of the fourth address to the first selection circuit in the column decoder as the second address;

passing a third portion of the fourth address to the second selection circuit in the column decoder as the third address;

sensing first data stored in memory cells located at the selected row and in the selected columns of the first block and concurrently sensing second data stored in memory cells located at the selected row and in the selected columns of the second block; and selecting through a third selection circuit coupled to the first and second selection circuits either the first or the second data as the group of data specified by the fourth address.

2. The method of claim 1 wherein determining whether the fourth address represents a group of cells in the first block or in the second block comprises comparing the fourth address to an address above which the fourth address will have to be modified in order to access the group of cells represented by the fourth address.

3. The method of claim 2 wherein selecting either the first or second data is based on comparing the fourth address to an address above which the fourth address will have to be modified.

4. The method of claim 1 wherein most significant bits of the fourth address are passed to the word decoder and wherein remaining bits are passed to the column decoder.

5. The method of claim 4 wherein the remaining bits are passed unchanged to the first selection block.

6. The method of claim 5 further comprising, modifying the remaining bits prior to passing them to the second selection block.

7. The method of claim 6 wherein modifying the remaining bits comprises subtracting the first number of memory cells from the remaining bits.

8. A memory device comprising:
a first block of memory cells arranged in rows and columns;
a second block of memory cells having rows aligned with the first block of memory cells, and having columns of memory cells separate from the first block of memory cells;
a word decoder coupled to the rows of memory cells and structured to simultaneously select one of the rows in the first and second block;
a column decoder having a first and second selection circuit, the first selection circuit coupled to the columns of memory cells in the first block and structured to select at least one of the columns in the first block, the second selection circuit coupled to the columns of the memory cells in the second block and structured to select at least one of the columns in the second block; and
an address splitter having an input for accepting an address, the address splitter coupled to the word decoder and to the first and second selection circuits, and the address splitter structured to pass a first portion of the address to the word decoder, pass a second portion of the address to the first selection circuit, and pass a third portion of the address to the second selection circuit; and
a third selection circuit coupled to the first and second selection circuits, the third selection circuit structured to receive a control signal based on the address, to receive a first set of data from the first selection circuit, to receive a second set of data from the second selection circuit, and to pass either the first set of data or the second set of data in response to the control signal.

9. The memory device of claim 8 wherein the address splitter is structured to strip a set of most significant bits from the address and pass them to the word decoder.

10. The memory device of claim 9 wherein the address consists of the most significant bits and remaining bits, and wherein the splitter is structured to pass the remaining bits to the first selection circuit.

11. The memory device of claim 8, further comprising a bit subtractor coupled between the address splitter and the second selection circuit.

12. The memory device of claim 11 wherein the bit subtractor is structured to subtract a representation of the number of cells in the first block of memory cells from the remaining bits and pass a result to the second selection circuit.

13. The memory device of claim 12, further comprising a third memory block coupled to the first block of memory cells, the word decoder, and the first selection circuit.

14. The memory device of claim 13 wherein the third memory block is a BootROM.

15. In a memory device including at least a first block containing a first number of memory cells and a second block containing a second number of memory cells, the memory cells organized in rows and columns such that the rows span the first and second blocks, and such that each column is in either the first or the second block, the first and second blocks being coupled to a word decoder that selects, based on a first address, one of the rows, the first block also being coupled to a first selection circuit in a column decoder that selects, based on a second address, at least one of the columns in the first block, and the second block being coupled to a second selection circuit in the column decoder that selects, based on a third address, at least one of the columns in the second block, a method comprising:
accepting a fourth address at an input address circuit;
determining whether the fourth address represents a group of cells in the first block or in the second block;
passing most significant bits of the fourth address to the word decoder as the first address;
passing remaining bits unchanged to the first selection circuit in the column decoder as the second address;
subtracting the first number of memory cells from the remaining bits to form modified remaining bits and passing the modified remaining bits to the second selection circuit in the column decoder as the third address;
sensing first data stored in memory cells located at the selected row and in the selected columns of the first block;
sensing second data stored in memory cells located at the selected row and in the selected columns of the second block; and
selecting either the first or second data as the group of data specified by the fourth address.

16. A memory device comprising:
a first block of memory cells arranged in rows and columns;
a second block of memory cells having rows aligned with the first block of memory cells, and having columns of memory cells separate from the first block of memory cells;
a word decoder coupled to the rows of memory cells and structured to simultaneously select one of the rows in the first and second block;
a column decoder having a first and second selection circuit, the first selection circuit coupled to the columns of memory cells in the first block and structured to select at least one of the columns in the first block, the second selection circuit coupled to the columns of the memory cells in the second block and structured to select at least one of the columns in the second block;
an address splitter having an input for accepting an address, the address splitter coupled to the word decoder and to the first and second selection circuits, and the address splitter structured to pass a first portion of the address to the word decoder, pass a second portion of the address to the first selection circuit, and pass a third portion of the address to the second selection circuit; and
a bit subtractor coupled between the address splitter and the second selection circuit.

17. The memory device of claim 16 wherein the bit subtractor is structured to subtract a representation of the number of cells in the first block of memory cells from the remaining bits and pass a result to the second selection circuit.

18. The memory device of claim 17, further comprising a third memory block coupled to the first block of memory cells, the word decoder, and the first selection circuit.

19. The memory device of claim 18 wherein the third memory block comprises a BootROM.

* * * * *